United States Patent [19]
Noren

[11] 3,748,544
[45] July 24, 1973

[54] LAMINATED CERAMIC HIGH-FREQUENCY SEMICONDUCTOR PACKAGE

[75] Inventor: Saul Noren, Hunterdon, N.J.
[73] Assignee: Plessey, Incorporated, New York, N.Y.

[22] Filed: Feb. 14, 1972
[21] Appl. No.: 225,734

[52] U.S. Cl. ...... 317/234 R, 317/234 G, 317/234 H, 174/52 S, 174/15
[51] Int. Cl. ............................ H01l 3/00, H01l 5/00
[58] Field of Search ......................... 317/234, 3, 3.1, 317/4, 4.1, 5; 174/52, DIG. 3, DIG. 5, 15

[56] References Cited

UNITED STATES PATENTS

| | | | |
|---|---|---|---|
| 3,404,215 | 10/1968 | Burk et al. | 317/234 |
| 3,478,161 | 11/1969 | Carley | 317/234 |
| 3,641,398 | 2/1972 | Fitzgerald | 317/234 |
| 3,651,434 | 3/1972 | McGeough et al. | 317/234 |
| 3,681,513 | 8/1972 | Hargis | 317/234 |

*Primary Examiner*—John W. Huckert
*Assistant Examiner*—Andrew J. James
*Attorney*—Louis E. Marn, James J. Burke et al.

[57] ABSTRACT

A laminated ceramic ring brazed to a beryllia base provides an improved package for high-frequency and high-power semiconductive devices. Hermetic seals provided by standard metallizing and brazing techniques are better than seals obtained with ceramic-glass seals used heretofore. Electrical connection is provided by conductive paths at the adjoining surfaces of the laminated ring.

7 Claims, 4 Drawing Figures

PATENTED JUL 24 1973

3,748,544

LAMINATED CERAMIC HIGH-FREQUENCY SEMICONDUCTOR PACKAGE

BACKGROUND OF THE INVENTION

The present invention relates generally to packages for high-frequency semiconductor devices and, more particularly, it relates to packages which must meet high standards of hermeticity.

Hermetic seals are common specifications for semiconductive device packages. Typically, obtaining such a seal required enclosing the device in a metal can soldered or brazed to a metal ring in the base. The well-known TO–8 header is typical of such packages. Efforts have also been made to construct ceramic packages for semiconductive devices and, of course, many such packages are widely used. However, problems have been encountered in ceramic packages which must be hermetic and which must also perform satisfactorily in high-frequency applications. More particularly, the glass seals employed in such packages would not hold up under the thermal cycling which was a normal part of processing or testing, and the resulting device was not hermetically sealed. At least, a sufficiently high percentage of such seals would fail, so that the package design was deemed unsatisfactory.

A typical high frequency package would include a beryllia base brazed to a copper stud. The base had a metallized bonding pad for the device and metallized lead patterns extending therefrom on its upper surface. A ceramic ring was sealed to the metallized beryllia with glass, enclosing the device and overlying the lead pattern. A cover of metal or ceramic, sealed to the ring, completed the package. Such a package should be hermetic when tested at $10^{-8}$ cc/sec using a helium mass spectrometer but, as noted above, the failure rate was too high for acceptance.

OBJECTS OF THE INVENTION

A general object of the present invention is to provide a ceramic package that is assembled with conventional brazing techniques rather than glass seals.

Another object of the invention is to provide a ceramic package that may be reliably sealed and which seal will remain hermetic through normal thermal cycling.

A further object of the invention is to provide a hermetic ceramic package adapted for high frequency applications.

Various other objects and advantages of the invention will become clear from the following description of embodiments thereof, and the novel features will be particularly pointed out in connection with the appended claims.

THE DRAWINGS

Reference will hereinafter be made to the accompanying drawings, wherein.

DESCRIPTION OF EMBODIMENTS

Figures 1, 2, 3, 4:
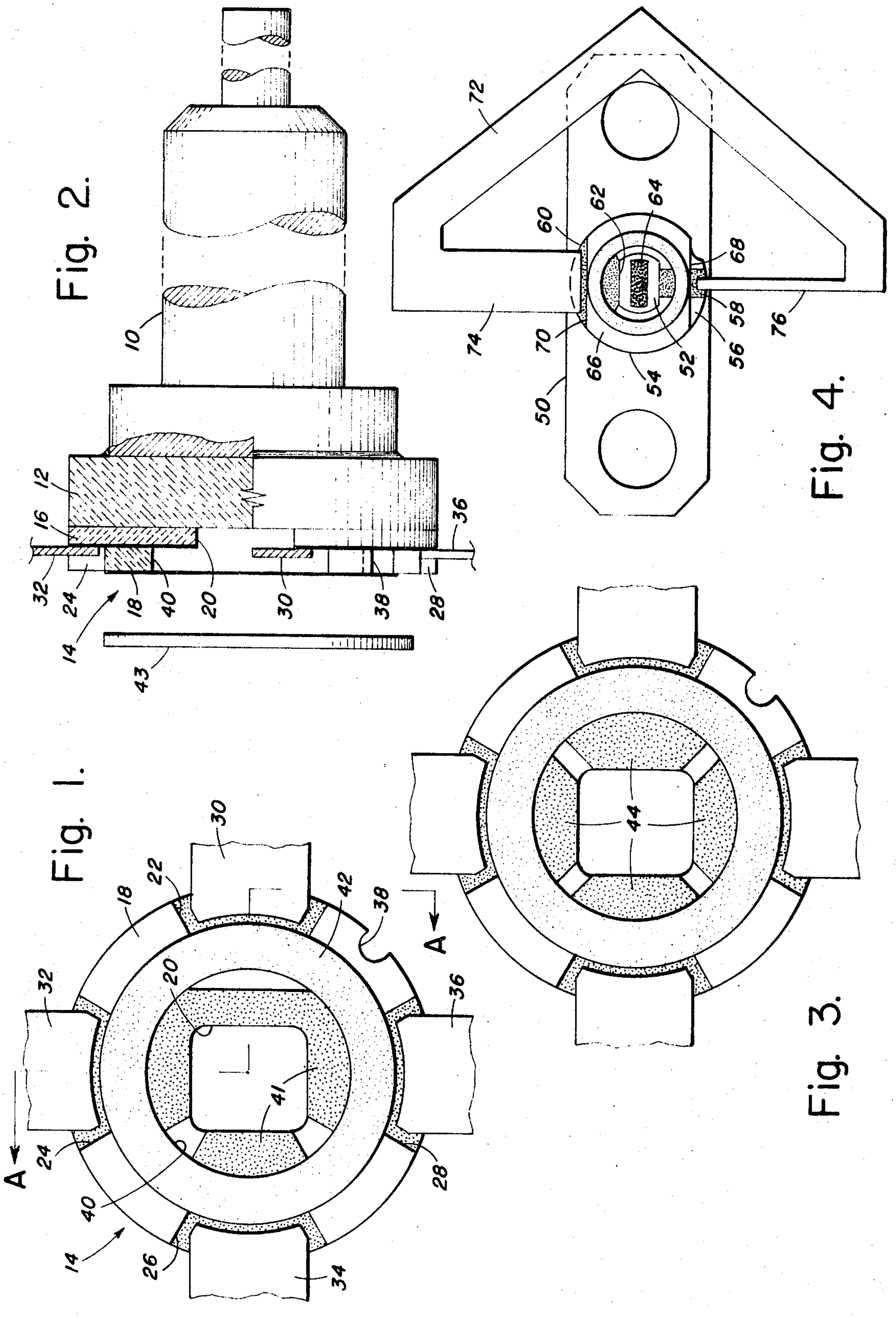
FIG. 1 is a top view of a preferred embodiment of the invention with the cover removed.
FIG. 2 is an elevation view of the embodiment shown in FIG. 1, partly in section, taken along line A—A of FIG. 1.
FIG. 3 is similar to FIG. 1 but showing a different metallization pattern.
FIG. 4 is a top view of an alternative embodiment of the invention.

In essence, the present invention comprises the use of a laminated alumina ceramic ring, in conjunction with a ceramic base of essentially conventional design, which can be brazed to the base using conventional brazing techniques to form a highly reliable hermetic seal therebetween. The adjoining laminated surfaces of the ring include the conductive paths for connection of the device. The base is commonly beryllia but may be alumina or another ceramic. The laminated ceramic ring is manufactured using conventional techniques, discussed in detail hereinbelow, which are well adapted for high reliability applications.

A package illustrating an embodiment of the invention is shown in FIGS. 1 and 2, and attention is directed thereto. Such a package is often referred to as a "hermetic power tower". A copper stud 10 is used for mounting purposes and as a heat sink. Brazed to the top of stud 10 is a beryllia disc 12, which forms the base of the package. The braze between stud 10 and disc 12, which is metallized on its bottom surface, is carried out with a suitable braze preform, typically a copper-silver eutectic alloy, or the like.

The laminated ceramic ring, indicated generally at 14, comprises a bottom ring 16 and a top ring 18. Ring 16 is the same outside diameter as base disc 12, and has a central orifice or opening 20 wherein the semiconductive device (not shown) is bonded to a metallized bonding pad on the top surface of beryllia disc 12. As shown, the opening 20 is square, but any convenient shape may be used. Top ring 18 is also of the same outside diameter as disc 12, but a plurality of radial notches have been cut therein. Notches 22,24,26,28 accommodate leads 30,32,34,36, which are bonded to appropriately metallized areas defining conductive paths on the top surface of bottom ring 16. A much smaller notch 38 corresponds to similar notches (not shown) in bottom ring 16 and disc 12, which are used merely for alignment purposes. The inside diameter 40 of top ring 18 is much larger than opening 20 in ring 16, exposing metallized areas 41 extending from the leads to the opening 20. Internal leads (not shown) connect these metallized areas to the device (also not shown).

The top surface of top ring 18 is metallized in a ring 42 extending from the inner edge of the notches 22 to the opening 40. This provides a bonding surface for the cover 43, which may be either metallized alumina or a metal such as Kovar (trademark).

Bonding of the laminated ring 14 to the beryllia base 12, and bonding of the leads 30 etc. to bottom ring 16 is done with suitable braze preforms. Bonding of the cover is done with suitable solder preforms, but only after insertion and wiring of the device.

The metallizing pattern 41 of the FIG. 1 device has two leads bridges. FIG. 3 is a similar device, but the pattern 44 is un-bridged. It will be appreciated that other configurations are also possible.

An alternative embodiment of the invention is shown in FIG. 4. A copper header 50 is used for mounting and heat sink purposes. As in previous embodiments, a beryllia disc (the top surface 52 of which is partly visible in the drawing) is brazed to header 50, and the laminated ring 54 is brazed to its top surface. In this embodiment, the top surface of bottom ring 56 has two metallized areas 58, 60 defining conductive paths from opposed outer edges of ring 56 to the edge of inner opening 62. A metallized bonding pad 64 for attachment of a semiconductive device (not shown) is visible within opening 62 on top surface 52 of the beryllia disc. The top ring 66 has opposed chord-shaped cut-out areas 68, 70 which expose the underlying metallized areas 58, 60 at the periphery of the device. This allows for the attachment of the lead frame 72 including a broad lead 74 and a narrow lead 76 to the respective conductive paths. The frame portion 72 is cut away during a later stage of manufacture. The top surface of top ring 66 has a metallized ring 78 thereon for attachment of the cover (not shown), as in previous embodiments. Also as in the other embodiments, the bond between the disc and the laminated ring and (after final assembly) the bond between the ring and the cover are hermetic seals using braze and solder preforms between appropriately metallized surfaces, this being made possible by isolating the conductive paths within the laminated ring.

Manufacture of the laminated ring is carried out as follows. The starting material is a green ceramic tape in what is commonly referred to as the leather hard condition. Such tapes are produced by well known procedures from slurries or slips of finely milled alumina suspended in a solvent with suitable binders and other additives. The slurry is cast onto a moving belt under a doctor blade. After most or all of the solvent evaporates, the tape is leather hard and may be separated from the belt and handled with reasonable ease. The tape is first cut into lengths and trimmed to uniform width suitable for subsequent processing.

A first tape, destined to become a large number of bottom rings 16, is metallized first on one side and then on the other. The pattern on one side is a circle corresponding in size to the disc 12 and the pattern on the other side, in registration with the metallization on the first side, corresponds to the desired lead pattern 41, 44 on the top surface of ring 16. Metallizing pastes and the proper procedures for use thereof are well known to those skilled in the art and need not be set forth in detail herein.

A second tape, which will become an equal number of top rings 18 as there are bottom rings on the first tape, is metallized only on one surface, in the ring pattern 42 that will ultimately be used for soldering cover 43.

Each tape is then passed through punches. In the first tape, the opening 20 is punched out, along with notch 38 and a plurality of registration holes which are used during manufacture only.

In the second tape, openings 40 are punched out, along with notches 22, 24 etc. and notch 38, and an identical number of registration holes.

The two tapes are then placed in registration in a laminating fixture which includes suitable pins corresponding to the registration holes in the tapes. The tapes are laminated with heat and pressure, but conditions of laminating (typically 70 psi and 200°F. for 1–2 minutes) in no sense cure the ceramic, which is carried out in a subsequent firing step.

After lamination, the rings are separated from the still green but laminated tape by punching the outside diameters. Firing of the laminated rings in a reducing atmosphere follows. Of course, in a ceramic firing operation some shrinkage always occurs, and this must be taken into account in sizing the unfired parts.

Assembly of the package can be carried out in a single operation. In a suitable fixture, stud 10, disc 12 and laminated ring 14 are assembled with two solder preforms therebetween. Leads are supplied in a lead frame which is later cut away, but which holds all leads in their proper relation. While solder preforms may also be used for lead bonding, it is more common for the leads to already have the solder alloy applied on the tips thereof. The assembled parts are then passed through a furnace maintained above the melting point of the brazing alloy, again in a reducing atmosphere (forming gas is commonly used).

It is to be noted that it is often desirable to plate one or more metals onto the metallized areas to improve bonding properties, corrosion resistance and/or electrical properties. Nickel and gold are commonly employed in electronic devices. Thus, the metallized areas of the fired parts may be finished with 50–200 $\mu$-in. of nickel before brazing or assembly. Final plating of the assembly usually includes 100 $\mu$-in. of nickel followed by 100 $\mu$-in. minimum of gold. It is to be understood that as used herein and in the appended claims, the words "metallized areas" and "metallizing" may include such plating.

Various changes in the details, steps, materials and arrangements of parts, as herein described and illustrated in order to explain the nature of the invention, may be made by those skilled in the art within the principle and scope of the invention as defined in the appended claims.

What is claimed is:

1. A package assembly for a semiconductive device comprising:

a ceramic base having top and bottom surfaces;

a laminated ceramic ring brazed to said top surface and comprising a bottom ring and a top ring laminated together;

said bottom ring having a first opening for mounting of a semiconductive device on said top surface of said base;

said top ring having a second opening larger than said first opening for electrical connection of conductive paths to said device, and also having cut-out areas adjacent the edge of said top ring;

a plurality of discrete metallized areas on said base and rings consisting essentially of:

a first metallized area on the top surface of said base defining a bonding pad for said semiconductive device;

a second metallized area on the top surface of said base surrounding said first area and defining a bond area between said top surface and the bottom surface of said bottom ring;

a third metallized area on other surfaces of said base to facilitate brazing to a stud;

a fourth metallized area on the bottom surface of said bottom ring matching said second area to facilitate brazing therebetween;

a plurality of discrete metallized areas on the top surface of said bottom ring defining conductive paths from the edge of said top ring exposed by said cut-out areas to the edge of said first opening; and an additional metallized area on the top surface of said top ring around said second opening to facilitate brazing a cover thereto.

2. The package assembly as claimed in claim 1, and additionally comprising outwardly extending metallic leads brazed to said conductive paths at said cut-out areas.

3. The package assembly as claimed in claim 1, and additionally comprising a metallic stud brazed to the bottom surface of said ceramic base.

4. The package assembly as claimed in claim 1, and additionally comprising a cover brazed to the metallized area of the top surface of said top ring.

5. The package assembly as claimed in claim 1, wherein said ceramic base is beryllia and said laminated ceramic ring is alumina.

6. In a hermetically sealed ceramic package for containing a semiconductive device, said package comprising a base with said device bonded thereto, a ceramic ring surrounding said device, bonded to said base and having a cover bonded thereto, the improvements comprising:

brazed joints between said ceramic ring and said base and between said ring and said cover;

said ceramic ring being a lamination of two rings of differing configuration, the top surface of the bottom ring having discrete metallized areas defining conductive paths for connection to said device near the inside edge and to cooperating lands near the outside edge, said bottom ring having a smaller inside diameter than said top ring, and said top ring having cut-out areas exposing said conductive paths near the outside edge thereof.

7. The package of claim 6, wherein said cut-out areas comprise said top ring having a smaller outside diameter than said bottom ring.

* * * * *